(12) United States Patent
Bell (10) Patent No.: US 7,990,299 B2
(45) Date of Patent: Aug. 2, 2011

(54) OPTICAL SAMPLING METHOD FOR ANALOG TO DIGITAL CONVERSION

(75) Inventor: John A. Bell, Seattle, WA (US)

(73) Assignee: The Boeing Company, Chicago, IL (US)

( * ) Notice: Subject to any disclaimer, the term of this patent is extended or adjusted under 35 U.S.C. 154(b) by 38 days.

(21) Appl. No.: 12/543,669

(22) Filed: Aug. 19, 2009

(65) Prior Publication Data

US 2011/0043396 A1    Feb. 24, 2011

(51) Int. Cl.
  *H03M 1/00* (2006.01)
(52) U.S. Cl. ........................................ 341/137; 341/155
(58) Field of Classification Search .................. 341/137, 341/155; 398/154, 155, 147; 385/5, 15, 385/16; 250/227.14, 227.21, 575, 576
  See application file for complete search history.

(56) References Cited

U.S. PATENT DOCUMENTS

| | | | | |
|---|---|---|---|---|
| 4,502,037 A | * | 2/1985 | Le Parquier et al. | 341/111 |
| 4,694,276 A | * | 9/1987 | Rastegar | 341/137 |
| 4,947,170 A | * | 8/1990 | Falk | 341/137 |
| 5,010,346 A | | 4/1991 | Hamilton et al. | |
| 5,068,738 A | * | 11/1991 | Miida | 348/345 |
| 5,629,699 A | | 5/1997 | Chazelas et al. | |
| 6,028,424 A | | 2/2000 | Twichell et al. | |
| 7,612,327 B2 | * | 11/2009 | Okada | 250/231.13 |
| 2007/0045525 A1 | * | 3/2007 | Tsai et al. | 250/231.13 |

OTHER PUBLICATIONS

Juodawlkis et al., "Optical Sampled Analog-to-Digital Converters", Transactions on Microwave Theory and Techniques, Oct. 2001, pp. 1840-1853, IEEE vol. 49, No. 10.
Bussjager et al., "Photonic Analog-to-Digital Converters", AFRL-SN-RS-TR-2006-109 In-House Final Technical Report, Mar. 2006, pp. 1-110, Air Force Research Laboratory/SNDP, Rome, New York.
Valley, "Photonic Analog-to-Digital Converters", Mar. 2007, pp. 1955-1982, vol. 15, No. 55, The Aerospace Corporation, Los Angeles, California.
Bell et al., "A/D Conversion of Microwave Signals Using a Hybrid Optical/Electronic Technique," Optical Technology for Microwave Applications V, 1991, pp. 326-329, SPIE vol. 1476.
Bell et al., "Optical Sampling and Demultiplexing Applied to A/D Conversion," Invited Paper, Devices for Optical Processing, 1991, pp. 276-280, SPIE vol. 1562.
EPO International Search Report for application No. PCT/US2010/044152 dated Nov. 12, 2010.

* cited by examiner

*Primary Examiner* — Brian Young
(74) *Attorney, Agent, or Firm* — Yee & Associates, P.C.

(57) ABSTRACT

A method and apparatus for encoding data. A first pair of optical signals having a first phase difference is generated in response to receiving an input signal having a voltage. A second pair of optical signals having a second phase difference is generated in response to receiving an input signal having a voltage. The first pair of optical signals is combined to form a first optical signal having a first intensity. The second pair of optical signals is combined to form a second optical signal having a second intensity. The first intensity of the first optical signal reaches a peak at a different time from the second intensity of the second optical signal.

20 Claims, 6 Drawing Sheets

OPTICAL SAMPLING METHOD FOR ANALOG TO DIGITAL CONVERSION

BACKGROUND INFORMATION

1. Field

The present disclosure relates generally to analog to digital conversion and, in particular, to digitizing analog signals using optical signals. Still more particularly, the disclosure relates to a method and apparatus for analog to digital conversion using modulated optical signals.

2. Background

Digital signal processing is used to measure and/or analyze analog signals. As a first step in digital signal processing, analog to digital conversion is used to convert analog signals into digital data for processing. For example, a continuous analog signal may be converted to digital data in the form of discrete values or numbers.

The resolution of an analog to digital converter is one determining factor for the accuracy of converting signals from analog to digital data. The resolution is the number of discrete values that can be produced over the range of analog values. Typically, these discrete values are stored in binary form, and the resolution is expressed in bits. The accuracy of converting analog signals into digital data is also determined by sources of noise, nonlinear components of the analog to digital converter, and/or other relevant factors.

The effective resolution of an analog to digital converter is limited by the maximum signal-to-noise ratio that can be achieved for the digital signal produced. Thus, an analog to digital converter may only resolve an analog signal to an effective number of bits of resolution (ENOB). The signal-to-noise ratio may depend on a sampling error that may, in turn, depend on the timing jitter. The timing jitter is the time variation in the time period.

Some currently available analog to digital converters use electronic sampling methods for analog signals. These electronic sampling methods have a timing jitter that is greater than about 500 femtoseconds. This timing jitter sets a limit to the signal-to-noise ratio. Other currently available analog to digital converters use optical sampling methods for analog signals. Optical sampling methods can have a reduced timing jitter of less than about 50 femtoseconds. With this reduced timing jitter, optical sampling methods can increase the signal-to-noise ratio as compared to electrical sampling methods.

With currently available systems for analog to digital conversion, the conversion of ultra-wideband input signals into digital signals has a limited effective number of bits of resolution for the digital signals produced. Ultra-wideband is a technology for transmitting information in the form of signals over a bandwidth greater than about 500 megahertz.

Therefore, it would be advantageous to have a method and apparatus that takes into account at least some of the issues discussed above, and possibly other issues.

SUMMARY

In one advantageous embodiment, an apparatus comprises a modulation system, an optical detector system, and an analog to digital conversion system. The modulation system is configured to generate a first pair of optical signals having a first phase difference and a second pair of optical signals having a second phase difference in response to an input signal. The first pair of optical signals is combined to form a first optical signal having a first intensity, and the second pair of optical signals is combined to form a second optical signal having a second intensity. The first intensity of the first optical signal reaches a peak at a different time from the second intensity of the second optical signal. The optical detector system is coupled to the modulation system. The optical detector system is configured to generate a first electrical signal corresponding to the first intensity of the first optical signal and a second electrical signal corresponding to the second intensity of the second optical signal. The analog to digital conversion system is connected to the optical detector system and is configured to generate digital data from the first electrical signal and the second electrical signal.

In another advantageous embodiment, a method is present for encoding data. A first pair of optical signals having a first phase difference is generated in response to receiving an input signal having a voltage. A second pair of optical signals having a second phase difference is generated in response to receiving an input signal having a voltage. The first pair of optical signals is combined to form a first optical signal having a first intensity. The second pair of optical signals is combined to form a second optical signal having a second intensity. The first intensity of the first optical signal reaches a peak at a different time from the second intensity of the second optical signal.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives, and advantages thereof, will best be understood by reference to the following detailed description of an advantageous embodiment of the present disclosure when read in conjunction with the accompanying drawings, wherein:

DETAILED DESCRIPTION

The different advantageous embodiments take into account and recognize a number of different considerations.

The different advantageous embodiments take into account and recognize that some currently used optically-based analog to digital converters use inverse sine processing with a limitation of about less than plus or minus pi/2 radians for a range of phase modulation. The range of phase modulation is selected to provide a desired effective number of bits of resolution. The different advantageous embodiments recognize that it may be desirable to have an analog to digital converter with a greater range of phase modulation than is possible with currently available systems.

The different advantageous embodiments also take into account and recognize that some currently available electro-optical analog to digital converters transform a single voltage signal into a single optical signal. The intensity of the optical signal is substantially linearly related to the amplitude of the sampled voltage. The effective number of bits of resolution of these analog to digital converters is limited in part by the linearity of the modulation system.

Further, the effective number of bits of resolution for these types of analog to digital converters may be limited by the dynamic range of the components configured for processing a single optical signal. These components include at least one of an optical modulator, an optical detector, an electrical amplifier, and an analog to digital conversion system. The dynamic range is the ratio of the full range of amplitude for a signal to the range of amplitude for the noise. For example, a signal may have a potential input amplitude range of about one volt, and the noise may have a range of amplitude of about one millivolt. In this example, the dynamic range may be about 1,000.

An increase in the dynamic range of the components for processing a single optical signal by a factor of about six may result in an increase in the effective number of bits of resolution by greater than about two bits. The different advantageous embodiments recognize that an increase in the range of phase modulation may lead to an increase in the dynamic range. Thus, an increase in the range of phase modulation may lead to an increase in the effective number of bits of resolution.

Further, the different advantageous embodiments take into account and recognize that it would be advantageous to have an analog to digital converter that can produce a digital signal with a desired effective number of bits of resolution of about 10 bits for an input signal of about 10 gigahertz bandwidth.

Thus, the different advantageous embodiments provide a method and apparatus for encoding data. In response to receiving an input signal having a voltage, a first pair of optical signals having a first phase difference and a second pair of optical signals having a second phase difference are generated. The first pair of optical signals is combined to form a first optical signal having a first intensity. The second pair of optical signals is combined to form a second optical signal having a second intensity. The first intensity is based on the first phase difference and the second intensity is based on the second phase difference. The first intensity reaches a peak at a different time from the second optical signal. In these illustrative examples, intensity also may be referred to as optical power.

The first optical signal is converted to a first electrical signal corresponding to the intensity of the first optical signal. The second optical signal is converted to a second electrical signal corresponding to the intensity of the second optical signal. Digital data is generated from the first electrical signal and the second electrical signal.

Figure 1:
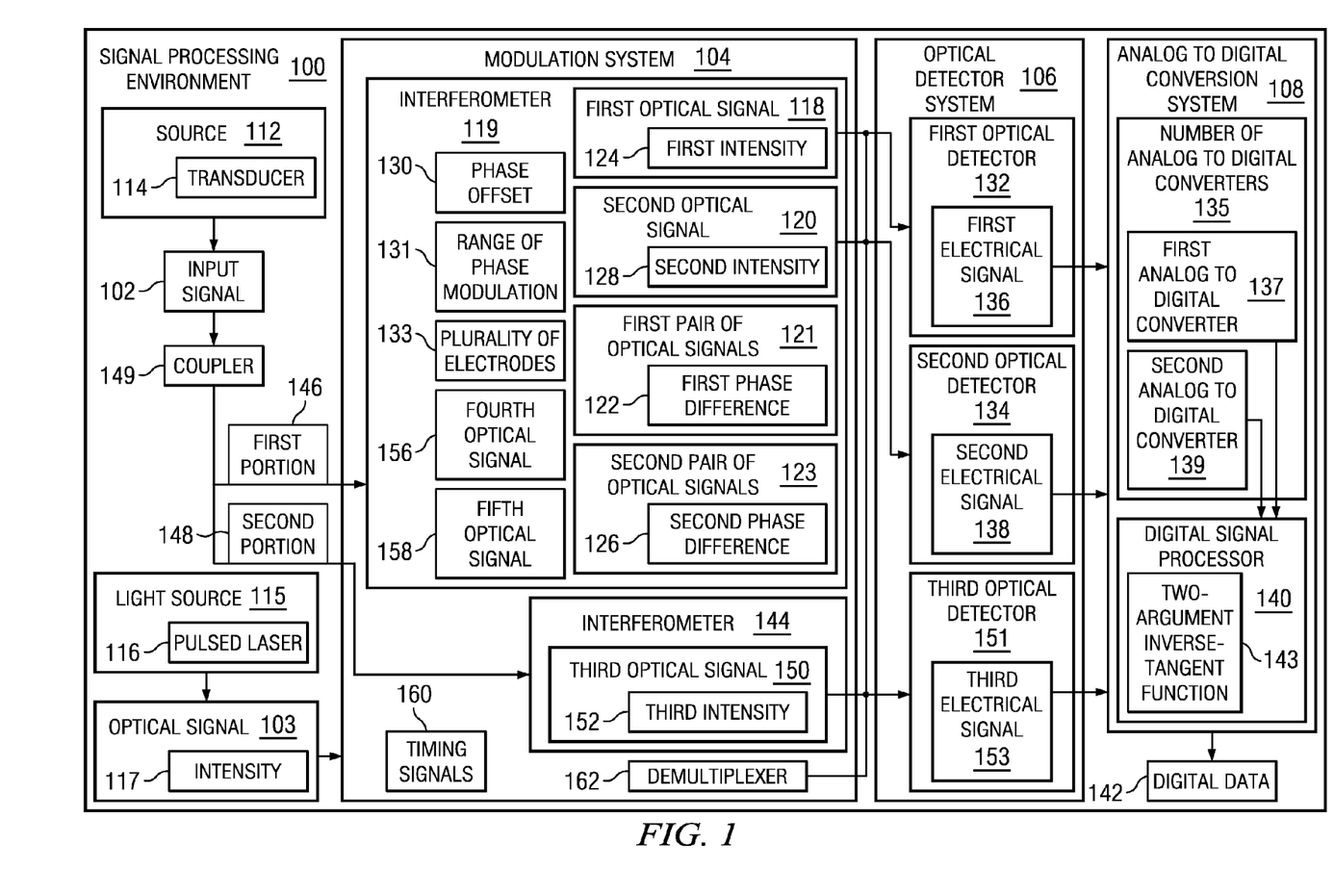
FIG. 1 is an illustration of a signal processing environment in accordance with an advantageous embodiment.

With reference now to FIG. 1, an illustration of a signal processing environment is depicted in accordance with an advantageous embodiment. In this illustrative example, signal processing environment 100 is used to convert an analog signal into digital data. Signal processing environment 100 includes input signal 102, optical signal 103, modulation system 104, optical detector system 106, and analog to digital conversion system 108.

In this illustrative example, input signal 102 takes the form of an analog signal. An analog signal is a signal that is continuous. For example, without limitation, input signal 102 is a voltage signal, a current signal, a frequency signal, or a charge signal. In these examples, input signal 102 is a signal received from a device, such as transducer 114. Transducer 114 may be, for example, a voltage sensor, a current sensor, or some other suitable device.

Optical signal 103 is generated by light source 115. In this illustrative example, light source 115 takes the form of pulsed laser 116. Pulsed laser 116 generates optical signal 103 with a substantially constant pulse rate and a substantially constant intensity for each pulse of optical signal 103. In this example, optical signal 103 has intensity 117.

For example, pulsed laser 116 generates optical signal 103 with intensity 117 for a first selected period of time and substantially no level of intensity for a second selected period of time. In this example, the first selected period of time may be brief compared with the second selected period of time. The selected period of time with intensity 117 for optical signal 103 may be referred to as a pulse generated by pulsed laser 116. The frequency at which the selected period of time with intensity 117 occurs is referred to as the pulse rate.

In this illustrative example, modulation system 104 may include a modulating device such as, for example, without limitation, interferometer 119. Interferometer 119 receives both input signal 102 and optical signal 103. As one example, input signal 102 may be a voltage signal that is applied to interferometer 119. Modulation system 104 uses optical signal 103 and input signal 102 to generate first optical signal 118 and second optical signal 120.

In this illustrative example, modulation system 104 generates first pair of optical signals 121 and second pair of optical signals 123 in response to input signal 102. First pair of optical signals 121 has first phase difference 122, and second pair of optical signals 123 has second phase difference 126.

First pair of optical signals 121 are combined to form first optical signal 118 having first intensity 124. In these examples, first intensity 124 is based on first phase difference 122. Further, second pair of optical signals 123 are combined to form second optical signal 120 having second intensity 128. Second intensity 128 is based on second phase difference 126.

In this illustrative example, first phase difference 122 is modulated by input signal 102 and is substantially linearly dependent on input signal 102. Second phase difference 126 is also modulated by input signal 102 to be substantially equal to first phase difference 122 to within phase offset 130. In this example, phase offset 130 is a substantially fixed phase offset.

In these illustrative examples, first optical signal 118 may be substantially proportional to (1+sin(kV)), and second optical signal 120 may be substantially proportional to (1+cos (kV)), where k is a constant and V is the amplitude of input signal 102. The term, kV, corresponds to phase in these examples. These properties for first optical signal 118 and second optical signal 120 are dependent on setting first phase difference 122 to be substantially zero when input signal 102 is substantially zero. Further, these properties are also dependent on setting second phase difference 126 to be about pi/2 radians when input signal 102 is substantially zero. In some examples, the phase settings for first optical signal 118 and second optical signal 120 may be set using at least a portion of plurality of electrodes 133.

First optical signal 118 and second optical signal 120 may be generated by modulation system 104 with range of phase modulation 131. In these illustrative examples, range of phase modulation 131 may be expressed as a multiple of pi radians. For example, without limitation, range of phase modulation 131 may be from about −pi to about +pi, about −2 pi to about +2 pi, about −3 pi to about +3 pi, and/or some other suitable range.

In this illustrative example, optical detector system 106 is coupled to modulation system 104. This coupling allows optical detector system 106 to receive optical signals from modulation system 104. Optical detector system 106 includes, without limitation, first optical detector 132 and second optical detector 134. First optical detector 132 receives first optical signal 118. In response to receiving first optical signal 118, first optical detector 132 is configured to generate first electrical signal 136 corresponding to first intensity 124 of first optical signal 118. Second optical detector 134 receives second optical signal 120. In response to receiving second optical signal 120, second optical detector 134 is configured to generate second electrical signal 138 corresponding to second intensity 128 of second optical signal 120.

Optical detector system 106 is connected to analog to digital conversion system 108. In these illustrative examples, analog to digital conversion system 108 may be comprised of number of analog to digital converters 135. In this illustrative example, number of analog to digital converters 135 comprises first analog to digital converter 137 and second analog to digital converter 139. First analog to digital converter 137 receives first electrical signal 136, and second analog to digital converter 139 receives second electrical signal 138.

Digital signal processor 140 in analog to digital conversion system 108 is configured to receive and process from the outputs from first analog to digital converter 137 and second analog to digital converter 139. These outputs may be digital signals for first electrical signal 136 and second electrical signal 138. In these examples, these digital signals may take the form of discrete values. Digital signal processor 140 processes these digital signals to generate digital data 142.

In these illustrative examples, digital signal processor 140 is configured to calculate an estimated value for V, the amplitude of input signal 102, for each pair of discrete values from first analog to digital converter 137 and second analog to digital converter 139. This calculation is performed by correcting for gain and offset for the output of first analog to digital converter 137 to estimate sin(kV). In a similar manner, gain and offset corrections are performed for the output of second analog to digital converter 139 to estimate cos(kV). These estimations, sin(kV) and cos(kV), are input into two-argument inverse-tangent function 143.

Without limitation, digital signal processor 140 may perform two-argument inverse-tangent function 143 using a look-up table method, a polynomial method, or some other suitable method. The output of two-argument inverse-tangent function 143 is an estimated value of kV. In these illustrative examples, k is a constant with units of radians per volts. For example, k is a constant with units for a phase shift in radians per amplitude of input signal 102 in volts. The quantity kV corresponds to first phase difference 122. In some examples, the estimated value of kV may be in the range from about −pi to about +pi radians. By using the estimated value of kV to determine the value for V, digital data 142 may be generated. In this manner, digital data 142 may include values for V corresponding to the amplitude of input signal 102 at the time of sampling in modulation system 104.

In some advantageous embodiments, modulation system 104 also may include interferometer 144. With this configuration for modulation system 104, first portion 146 of input signal 102 is sent to interferometer 119, and second portion 148 of input signal 102 is sent to interferometer 144. In these illustrative examples, input signal 102 may be sent through coupler 149 to generate first portion 146 and second portion 148 of input signal 102.

Both interferometer 119 and interferometer 144 receive optical signal 103 from light source 115. In other advantageous embodiments, a different type of modulating device may take the place of interferometer 144. For example, an electro-absorption modulator may take the place of interferometer 144 in modulation system 104.

Interferometer 144 generates third optical signal 150. Third optical signal 150 has third intensity 152 substantially proportional to input signal 102. Third optical signal 150 may be received by third optical detector 151 in optical detector system 106. Third optical detector 151 generates third electrical signal 153.

In this illustrative example, analog to digital conversion system 108 processes third electrical signal 153 to recover first phase difference 122 produced by input signal 102. In other words, when range of phase modulation 131 is greater than about −pi to about +pi, digital signal processor 140 may process third electrical signal 153 to recover the correct value of kV even if the value is beyond the range of about −pi to about +pi. The processing of third electrical signal 153 allows digital data 142 to have values substantially linearly proportional to the corresponding values of input signal 102 even if range of phase modulation 131 is beyond from about −pi to about +pi.

In still other advantageous embodiments, interferometer 119 may be configured to generate fourth optical signal 156 and fifth optical signal 158. Fourth optical signal 156 may be substantially proportional to (1−sin(kV)), and fifth optical signal 158 may be substantially proportional to (1−cos(kV)). In this illustrative example, k is a constant, and V is the amplitude of input signal 102 when input signal 102 is a voltage signal.

Fourth optical signal 156 and fifth optical signal 158 are used to compensate for fluctuations in optical signal 103 from light source 115. For example, these optical signals are used to compensate for fluctuations in the optical pulse energy of optical signal 103 received from pulsed laser 116.

The illustration of signal processing environment 100 in FIG. 1 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, first pair of optical signals 121 and second pair of optical signals 123 are generated in response to input signal 102 outside of modulation system 104. In some advantageous embodiments, first phase difference 122 for first pair of optical signals 121 and second phase difference 126 for second pair of optical signals 123 may be created outside of modulation system 104. In these advantageous embodiments, first pair of optical signals 121 and second pair of optical signals 123 may then be combined within modulation system 104 to form first optical signal 118 and second optical signal 120, respectively.

Further, modulation system 104 may be configured such that first optical signal 118 is generated by interferometer 119, third optical signal 150 is generated by interferometer 144, and second optical signal 120 is generated by a different interferometer. With this type of configuration for modulation system 104, these interferometers may be implemented using a currently available interferometer, such as a Mach-Zehnder interferometer. Further, in other advantageous embodiments, when input signal 102 is a voltage signal, the voltage signal may be sent through an amplifier before being applied to modulation system 104.

In some advantageous embodiments, signal processing environment 100 may include demultiplexer 162. Demultiplexer 162 may take the form of a time demultiplexer in these examples. Demultiplexer 162 may be used to divide optical signals to slow down the rates for sampling these optical signals. For example, demultiplexer 162 may be used to divide first optical signal 118 into eight different optical signals to be sent to eight different optical detectors within optical detector system 106. Further, these eight optical detectors may generate eight different electrical signals to be sent to eight different analog to digital converters within analog to digital conversion system 108. In this manner, first optical signal 118 is converted to a digitized signal with analog to digital converters operating at about one eighth of the pulse rate of pulsed laser 116. Demultiplexer 162 may allow for improved processing of optical signals as compared to environments that do not have a demultiplexer.

In some configurations for signal processing environment 100, timing signals 160 may be used to synchronize the operations performed within signal processing environment 100. For example, timing signals 160 may be generated by pulsed laser 116 or some other suitable clock source. Timing signals 160 synchronize demultiplexer 162 and analog to digital conversion system 108 to pulsed laser 116.

Timing signals 160 may take the form of, for example, without limitation, pulses, sine waves, and/or other suitable types of signals. In general, timing signals 160 are adjusted in phase, amplitude, and frequency. These adjustments are made to timing signals 160 such that demultiplexer 162 routes only the desired optical pulses to different optical detectors within optical detector system 106. Further, these adjustments are made to timing signals 160 such that analog to digital conversion system 108 generates digital data at the peaks of the pulses detected by optical detector system 106.

Figure 2:
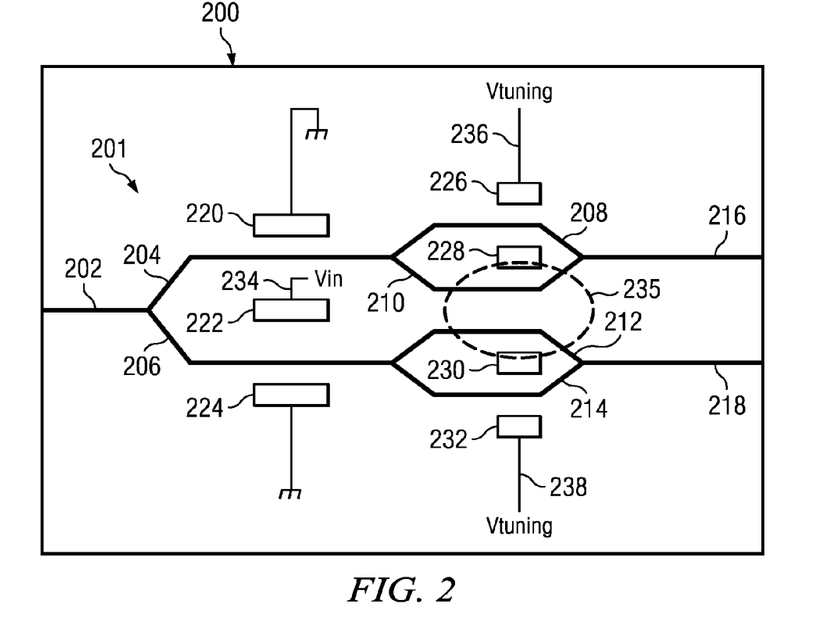
FIG. 2 is an illustration of a modulation system in accordance with an advantageous embodiment.

With reference now to FIG. 2, an illustration of a modulation system is depicted in accordance with an advantageous embodiment. In this illustrative example, modulation system 200 is an example of one implementation for modulation system 104 in FIG. 1. Modulation system 200 includes interferometer 201, which may be one example of interferometer 119 in FIG. 1. Further, modulation system 200 includes waveguides 202-218 and electrodes 220-232.

Modulation system 200 receives an optical signal through waveguide 202. This optical signal may be received from a light source, such as pulsed laser 116 in FIG. 1. In this example, waveguide 202 may be, for example, without limitation, a single-mode waveguide. Waveguide 202 splits into waveguide 204 and waveguide 206. In this illustrative example, waveguide 202 may be split into waveguide 204 and waveguide 206 using a mechanism that splits or divides optical signals. The mechanism may be a splitter such as, for example, without limitation, a Y-branch splitter. Waveguide 204 and waveguide 206 carry optical signals with substantially equal intensities.

In this illustrative example, voltage signal 234 is applied across electrodes 220, 222, and 224 of interferometer 201 to create an electrical field in waveguide 204 and waveguide 206. The polarity of the electrical field in waveguide 204 is opposite the polarity of the electrical field in waveguide 206. Further, the application of voltage signal 234 creates a phase difference between the optical signal traveling in waveguide 204 and the optical signal traveling in waveguide 206.

Waveguide 204 splits into waveguide 208 and waveguide 210 to form a first pair of optical signals traveling in waveguide 208 and waveguide 210. In these illustrative examples, one of the first pair of optical signals travels in waveguide 208, and the other of the first pair of optical signals travels in waveguide 210. Waveguide 206 splits into waveguide 212 and waveguide 214 to form a second pair of optical signals traveling in waveguide 212 and waveguide 214. In these illustrative examples, one of the second pair of optical signals travels in waveguide 212, and the other of the first pair of optical signals travels in waveguide 214. Waveguide 204 and waveguide 206 may be split using, for example, a Y-branch splitter.

Waveguides 208, 210, 212, and 214 carry optical signals with substantially equal intensities. Further, the first pair of optical signals traveling in waveguide 208 and waveguide 210 enters these waveguides having substantially the same phase as the optical signal traveling in waveguide 204. The second pair of optical signals traveling in waveguide 212 and waveguide 214 enters these waveguides having substantially the same phase as the optical signal traveling in waveguide 206.

In this illustrative example, coupling region 235 transfers the optical signal traveling in waveguide 210 to waveguide 212 and the optical signal traveling in waveguide 212 to waveguide 210. In other words, waveguide 210 and waveguide 212 are brought within a selected distance from each other to achieve a desired amount of coupling between waveguide 210 and waveguide 212. In this illustrative example, the desired amount of coupling may be the transfer of substantially all of the optical signals in the waveguide.

Voltage 236 is applied across electrode 226 and electrode 228 to adjust the phases of the first pair of optical signals traveling in waveguide 208 and waveguide 210 to create a first phase difference between these optical signals. This first phase difference may be adjusted such that the first pair of optical signals that travel in waveguide 208 and waveguide 210 combine to form an optical signal having a first intensity within waveguide 216. In this illustrative example, this combination may be achieved using, for example, without limitation, a Y-branch mechanism.

The first intensity of the optical signal traveling in waveguide 216 is based on the first phase difference created between the first pair of optical signals traveling in waveguide 208 and waveguide 210. This first intensity is substantially proportional to $(1+\sin(kV+P))$, where k is a constant, V is the amplitude of voltage signal 234, and P is a phase offset. Voltage 236 may be set such that the phase offset, P, is substantially zero.

Further, voltage 238 is applied across electrode 230 and electrode 232 to the phases of the second pair of optical signals traveling in waveguide 212 and waveguide 214 to create a second phase difference between these optical signals. This second phase difference may be adjusted such that the second pair of optical signals that travel in waveguide 212 and waveguide 214 combine to form an optical signal with a second intensity within waveguide 218. In this illustrative example, this combination may be achieved using, for example, without limitation, a Y-branch mechanism.

This second intensity of the optical signal traveling in waveguide 218 is based on the second phase difference created between the second pair of optical signals traveling in waveguide 208 and waveguide 210. This second intensity is substantially proportional to (1+cos(kV+P)). Voltage 238 may be set such that the phase offset, P, is substantially zero.

In this illustrative example, the combination of the first pair of optical signals in waveguide 208 and waveguide 210 and the combination of the second pair of optical signals in waveguide 212 and waveguide 214 may be a constructive combination or a destructive combination. The phase difference between the optical signals in the pairs of optical signals determines whether the combination is constructive or destructive. This combination also may be referred to as interference. The interference may be a constructive interference or a destructive interference.

For example, the first phase difference between the first pair of optical signals in waveguide 208 and waveguide 210 may be such that the optical signal produced in waveguide 216 by combining the first pair of optical signals has a greater intensity than the intensity of either of the optical signals in waveguide 208 or waveguide 210. This combination is a constructive combination in this example.

Further, the first phase difference between the first pair of optical signals in waveguide 208 and waveguide 210 may be such that the optical signal produced in waveguide 216 by combining the first pair of optical signals has a lesser intensity than the intensity of either of the optical signals in waveguide 208 or waveguide 210. This combination is a destructive combination.

In these illustrative examples, the optical signal in waveguide 216 and the optical signal in waveguide 218 may then be transmitted to an optical detector system such as, for example, optical detector system 106 in FIG. 1.

Figure 3:
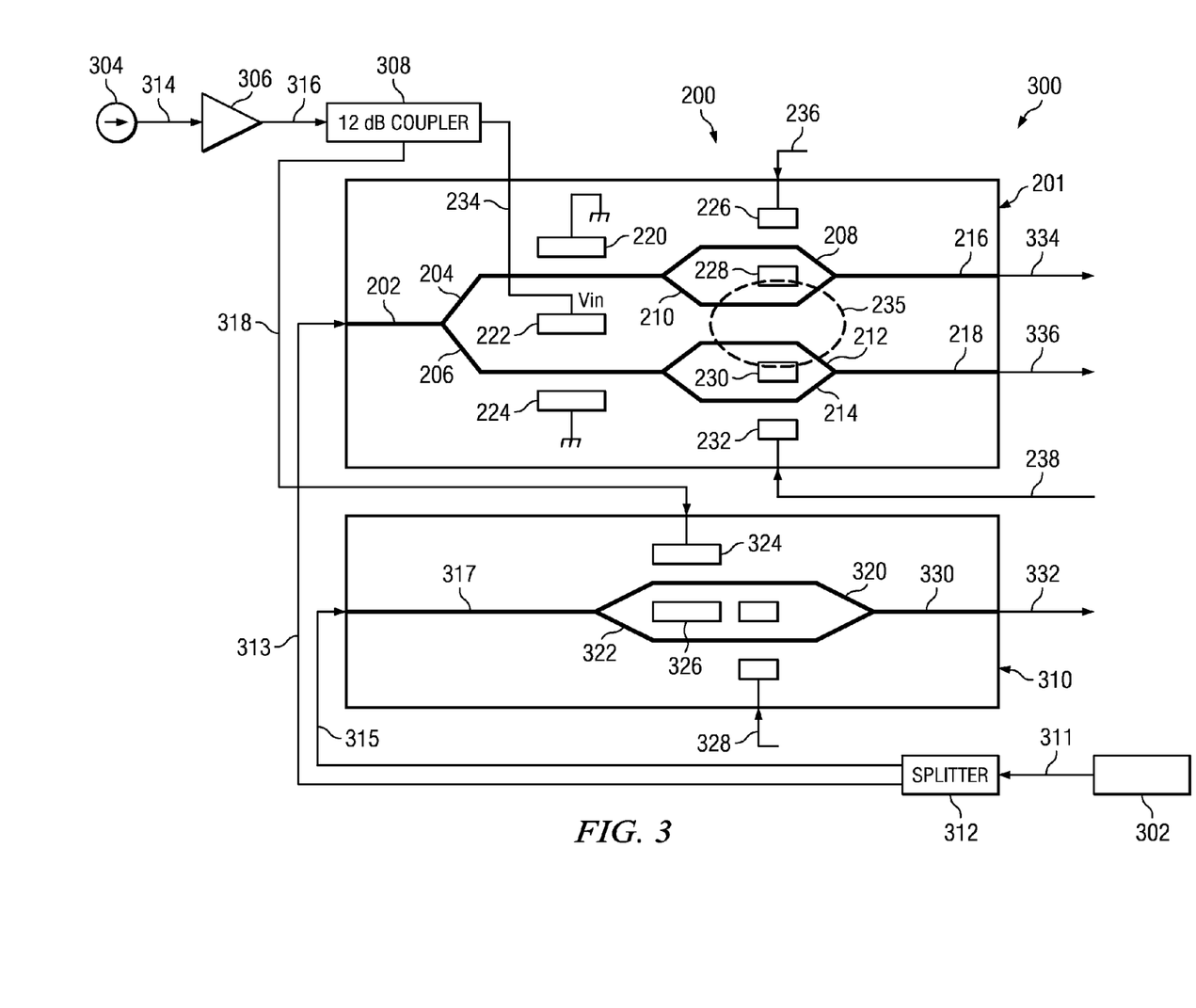
FIG. 3 is an illustration of a portion of a signal processing environment in accordance with an advantageous embodiment.

With reference now to FIG. 3, an illustration of a portion of a signal processing environment is depicted in accordance with an advantageous embodiment. As depicted in this illustrative example, signal processing environment 300 is an example of one implementation of signal processing environment 100 in FIG. 1.

In this example, signal processing environment 300 includes modulation system 200 as depicted in FIG. 2, pulsed laser 302, transducer 304, amplifier 306, and coupler 308. In this illustrative example, modulation system 200 includes interferometer 201, as depicted in FIG. 2, and interferometer 310.

Pulsed laser 302 generates optical signal 311. Optical signal 311 is split by splitter 312 into optical signal 313 and optical signal 315. Optical signal 313 and optical signal 315 may have substantially equal intensities and pulse rates. Optical signal 313 is sent to interferometer 201 through waveguide 202. Optical signal 315 is sent to interferometer 310 through waveguide 317.

In this illustrative example, transducer 304 generates voltage signal 314. Voltage signal 314 is sent to amplifier 306. Amplifier 306 amplifies voltage signal 314 to form voltage signal 316.

Voltage signal 316 is then sent through coupler 308 to generate voltage signal 234 and voltage signal 318. Voltage signal 234 is applied to interferometer 201, as depicted in FIG. 2, and voltage signal 318 is applied to interferometer 310. In this illustrative example, voltage signal 234 is a first portion of voltage signal 316, and voltage signal 318 is a second portion of voltage signal 316. In this illustrative example, coupler 308 is configured to generate this first portion and this second portion of voltage signal 316. For example, coupler 308 may generate voltage signal 234 that is about one-quarter of voltage signal 318.

The amounts of these portions relative to voltage signal 318 may be selected based on a desired range of phase modulation. In this illustrative example, the desired range of phase modulation may be substantially equal to about −2pi to about +2pi. In other examples, a range of phase modulation substantially equal to about −3pi to about +3pi may be obtained with coupler 308 configured to generate voltage signal 234 that is about one-sixth of voltage signal 318.

In this illustrative example, waveguide 317 splits into waveguide 320 and waveguide 322. The optical signals traveling in waveguide 320 and waveguide 322 have substantially equal intensities. Voltage signal 318 is applied to interferometer 310 across electrode 324 and electrode 326. The application of voltage signal 318 generates an electrical field in waveguide 320 and waveguide 322. These electrical fields create a phase difference between the optical signal traveling in waveguide 320 and the optical signal traveling in waveguide 322.

As depicted in this example, voltage 328 is applied to interferometer 310 to adjust the phase of the optical signal traveling in waveguide 322. This phase is adjusted such that when waveguide 320 and waveguide 322 interfere within waveguide 330, optical signal 332 traveling in waveguide 330 has an intensity that is substantially proportional to voltage signal 316.

In this illustrative example, optical signal 332 in waveguide 330, optical signal 334 in waveguide 216, and optical signal 336 in waveguide 218 are sent to an optical detector system, such as optical detector system 106 in FIG. 1, and then to an analog to digital conversion system, such as analog to digital conversion system 108 in FIG. 1. Optical signal 332 is used to recover voltage signal 316 when optical signal 334 and optical signal 336 are processed to form digital data based on voltage signal 316.

Figure 4:
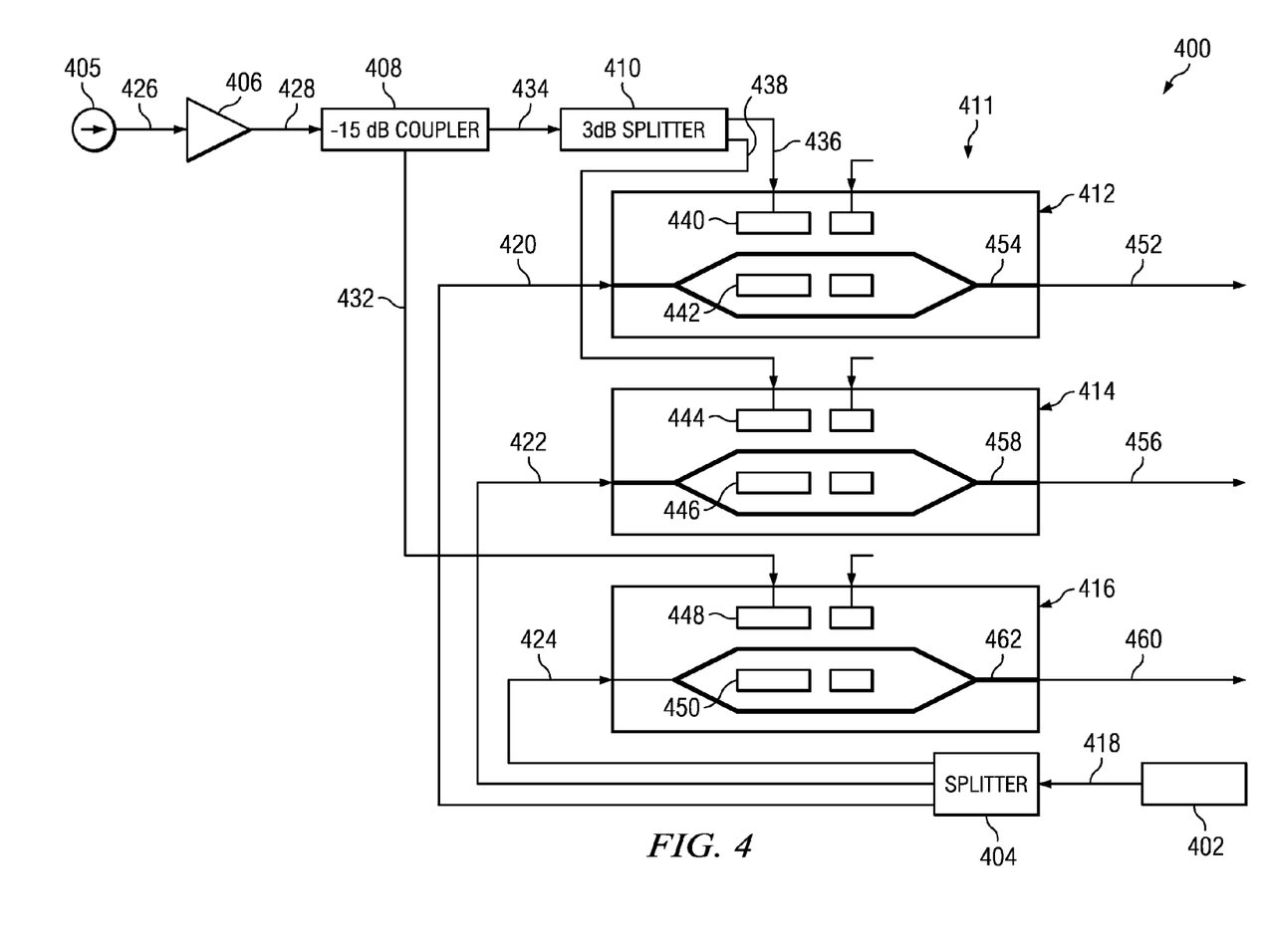
FIG. 4 is an illustration of a portion of a signal processing environment in accordance with an advantageous embodiment.

With reference now to FIG. 4, an illustration of a portion of a signal processing environment is depicted in accordance with an advantageous embodiment. In this illustrative example, signal processing environment 400 is an example of one implementation for signal processing environment 100 in FIG. 1. Signal processing environment 400 includes pulsed laser 402, splitter 404, transducer 405, amplifier 406, coupler 408, splitter 410, and modulation system 411. Modulation system 411 includes interferometer 412, interferometer 414, and interferometer 416.

As depicted in this example, pulsed laser 402 generates optical signal 418 and sends optical signal 418 to splitter 404. Splitter 404 splits optical signal 418 into optical signals 420, 422, and 424. Optical signals 420, 422, and 424 have substantially equal intensities. Optical signal 420 is sent to interferometer 412; optical signal 422 is sent to interferometer 414; and optical signal 424 is sent to interferometer 416.

In this illustrative example, transducer 405 sends voltage signal 426 to amplifier 406. Amplifier 406 amplifies voltage signal 426 to form voltage signal 428 and sends voltage signal 428 to coupler 408. In this example, coupler 408 splits voltage signal 428 into a first portion as voltage signal 432 and a second portion as voltage signal 434. Voltage signal 432 and voltage signal 434 are split in a ratio dependent on the desired range of phase modulation.

As depicted, voltage signal 428 is further split by splitter 410 into voltage signal 436 and voltage signal 438. Voltage signal 436 and voltage signal 438 have substantially equal amplitudes. Voltage signal 436 is applied across electrodes 440 and 442 of interferometer 412, and voltage signal 438 is applied across electrodes 444 and 446 of interferometer 414. Voltage signal 432 is applied across electrodes 448 and 450 of interferometer 416.

In this illustrative example, interferometer 412 is configured to generate optical signal 452 through waveguide 454. Optical signal 452 has an intensity that is substantially proportional to $(1+\sin(kV))$. In this example, k is a constant, and V is the amplitude of voltage signal 426. Interferometer 414 is configured to generate optical signal 456 through waveguide 458. Optical signal 456 has an intensity substantially proportional to $(1+\cos(kV))$. Further, interferometer 416 is configured to generate optical signal 460 through waveguide 462. Optical signal 460 may be generated such that optical signal 460 has an intensity proportional to voltage signal 426.

In this illustrative example, modulator system 411 is configured such that optical signals 452, 456, and 460 may be substantially proportional to optical signals 334, 336, and 332 in FIG. 3. In other words, modulation system 411 may be configured to generate optical signals similar to modulation system 200 in FIG. 3.

Figure 5:
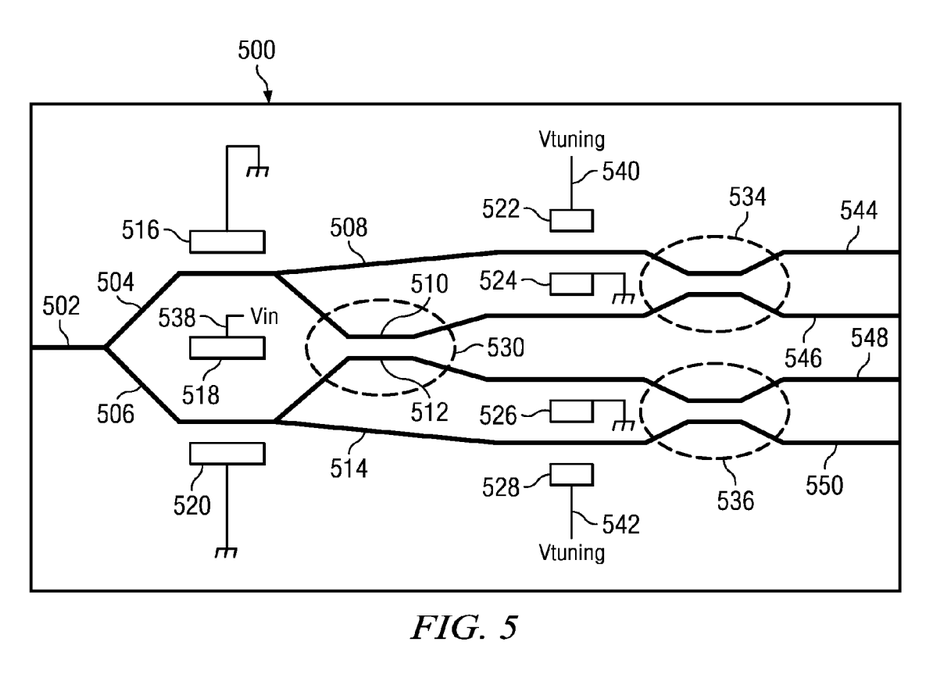
FIG. 5 is an illustration of a modulation system in accordance with an advantageous embodiment.

With reference now to FIG. 5, an illustration of a modulation system is depicted in accordance with an advantageous embodiment. In this illustrative example, modulation system 500 is an example of one implementation for modulation system 104 in FIG. 1. Modulation system 500 includes interferometer 501, which may be one example of interferometer 119 in FIG. 1. Further, modulation system 500 includes waveguides 502-514 and electrodes 516-528.

Modulation system 500 receives an optical signal through waveguide 502. This optical signal may be received from a light source, such as pulsed laser 116 in FIG. 1. In this example, waveguide 502 may be, for example, without limitation, a single-mode waveguide. Waveguide 502 splits into waveguide 504 and waveguide 506. In this illustrative example, waveguide 502 may be split into waveguide 504 and waveguide 506 using a mechanism that splits or divides optical signals. The mechanism may be a splitter such as, for example, without limitation, a Y-branch splitter. Waveguide 504 and waveguide 506 carry optical signals with substantially equal intensities.

In this illustrative example, voltage signal 538 is applied across electrodes 516, 518, and 520 of interferometer 501 to create an electrical field in waveguide 504 and waveguide 506. The polarity of the electrical field in waveguide 504 is opposite the polarity of the electrical field in waveguide 506. Further, the application of voltage signal 538 creates a phase difference between the optical signal traveling in waveguide 504 and the optical signal traveling in waveguide 506.

Waveguide 504 splits into waveguide 508 and waveguide 510 to form a first pair of optical signals traveling in waveguide 508 and waveguide 510. In these illustrative examples, one of the first pair of optical signals travels in waveguide 508, and the other of the first pair of optical signals travels in waveguide 510. Waveguide 506 splits into waveguide 512 and waveguide 514 to form a second pair of optical signals traveling in waveguide 512 and waveguide 514. In these illustrative examples, one of the first pair of optical signals travels in waveguide 512, and the other of the first pair of optical signals travels in waveguide 514.

Waveguides 508, 510, 512, and 514 carry optical signals with substantially equal intensities. Further, the first pair of optical signals traveling in waveguide 508 and waveguide 510 enters these waveguides having substantially the same phase as the optical signal traveling in waveguide 504. The second pair of optical signals traveling in waveguide 512 and waveguide 514 enters these waveguides having substantially the same phase as the optical signal traveling in waveguide 506.

In this illustrative example, coupling region 530 transfers the optical signal traveling in waveguide 510 to waveguide 512 and the optical signal traveling in waveguide 512 to waveguide 510. In other words, waveguide 510 and waveguide 512 are brought within a selected distance from each other to achieve a desired amount of coupling between waveguide 510 and waveguide 512. In this illustrative example, the desired amount of coupling may be the transfer of substantially all of the optical signals in the waveguide.

Voltage 540 is applied across electrode 522 and electrode 524 to adjust the phases of the first pair of optical signals traveling in waveguide 508 and waveguide 510 to create a first phase difference between these optical signals. These optical signals then travel through coupling region 534. Coupling region 534 transmits a portion of the optical signal traveling in waveguide 508 to waveguide 510 and a portion of the optical signal traveling in waveguide 510 to waveguide 508.

In this manner, the optical signal traveling in portion 544 of waveguide 508 after coupling region 534 is a combination of a portion of each of the first pair of optical signals traveling in waveguide 508 and waveguide 510 prior to coupling region 534. This combination may be a constructive combination or a destructive combination, depending on the first phase difference created by the application of voltage 540 across electrodes 522 and 524.

The optical signal in portion 544 of waveguide 508 has an intensity that is substantially proportional to $(1+\sin(kV+P))$. In this equation, k is a constant, V is the amplitude of voltage signal 538, and P is a phase offset. Voltage 540 may be set such that the phase offset, P, is substantially zero.

Further, the optical signal traveling in portion 546 of waveguide 510 after coupling region 534 is a combination of a portion of each of the first pair of optical signals traveling in waveguide 508 and waveguide 510. The optical signal in portion 546 of waveguide 510 has an intensity that is substantially proportional to $(1-\sin(kV+P))$.

Further, voltage 542 is applied across electrode 526 and electrode 528 to adjust the phases of the second pair of optical signals traveling in waveguide 512 and waveguide 514 to create a second phase difference between these optical signals. These optical signals then travel through coupling region 536. Coupling region 536 transmits a portion of the optical signal traveling in waveguide 512 to waveguide 514 and a portion of the optical signal traveling in waveguide 514 to waveguide 512.

In this manner, the optical signal traveling in portion 548 of waveguide 512 after coupling region 536 is a combination of a portion of each of the second pair of optical signals traveling in waveguide 512 and waveguide 514 prior to coupling region 536. This combination may be a constructive combination or a destructive combination, depending on the first phase difference created by the application of voltage 542 across electrodes 526 and 528.

The optical signal in portion 548 of waveguide 512 has an intensity that is substantially proportional to $(1+\sin(kV+P))$, where k is a constant, V is the amplitude of voltage signal 538 and P is a phase offset. Voltage 542 may be set such that the phase offset, P, is substantially zero.

Further, the optical signal traveling in portion 550 of waveguide 514 is a combination of a portion of each of the second pair of optical signals traveling in waveguides 512 and 514. The intensity of the optical signal traveling in portion 550 of waveguide 514 has an intensity that is substantially proportional to $(1-\sin(kV+P))$.

Figure 6:
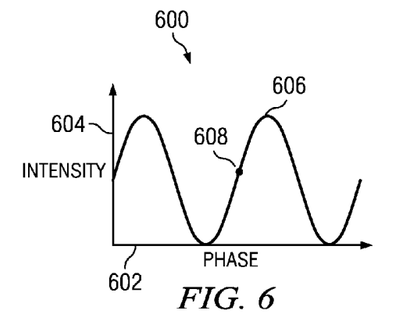
FIG. 6 is an illustration of a graph of phase in accordance with an advantageous embodiment.

With reference now to FIG. 6, an illustration of a graph of intensity is depicted in accordance with an advantageous embodiment. Graph 600 illustrates the intensity of an optical signal, such as first optical signal 118 generated by modulation system 104 in FIG. 1. In this illustrative example, graph 600 has horizontal axis 602 and vertical axis 604.

Horizontal axis 602 represents phase, and vertical axis 604 represents (1+sin(phase)). The phase in horizontal axis 602 is substantially proportional to a voltage signal, such as input signal 102 in FIG. 1. In other words, vertical axis 604 is substantially proportional to (1+sin(kV)), where k is a constant, and V is the amplitude of the voltage signal.

As depicted, curve 606 is substantially proportional to the intensity of first optical signal 118 in FIG. 1. Point 608 of curve 606 corresponds to a value of about zero for a voltage signal, such as input signal 102 in FIG. 1.

Figure 7:
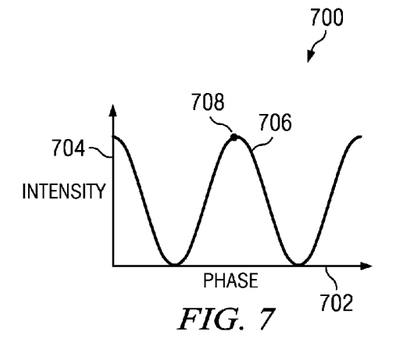
FIG. 7 is an illustration of a graph of phase in accordance with an advantageous embodiment.

With reference now to FIG. 7, an illustration of a graph of intensity is depicted in accordance with an advantageous embodiment. Graph 700 illustrates the intensity of an optical signal, such as second optical signal 120 generated by modulation system 104 in FIG. 1. In this illustrative example, graph 700 has horizontal axis 702 and vertical axis 704.

Horizontal axis 702 represents phase, and vertical axis 704 represents (1+cos(phase)). The phase in horizontal axis 702 is substantially proportional to a voltage signal, such as input signal 102 in FIG. 1. In other words, vertical axis 704 is substantially proportional to (1+cos(kV)), where k is a constant, and V is the amplitude of the voltage signal.

As depicted, curve 706 is substantially proportional to the intensity of second optical signal 120 in FIG. 1. As depicted in FIG. 7 and FIG. 6, curve 706 reaches a peak at a different time than when wave 606 reaches a peak. Further, point 708 of curve 706 corresponds to a value of about zero for a voltage signal, such as input signal 102 in FIG. 1.

Figure 8:
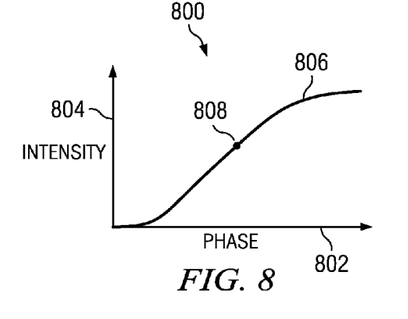
FIG. 8 is an illustration of a graph of phase in accordance with an advantageous embodiment.

With reference now to FIG. 8, an illustration of a graph of intensity is depicted in accordance with an advantageous embodiment. Graph 800 illustrates the intensity of an optical signal, such as third optical signal 150 generated by modulation system 104 in FIG. 1. In this illustrative example, graph 800 has horizontal axis 802 and vertical axis 804.

Horizontal axis 802 represents phase, and vertical axis 804 represents (1+sin(phase)). The phase in horizontal axis 802 is substantially proportional to a voltage signal, such as input signal 102 in FIG. 1. In other words, vertical axis 804 is substantially proportional to (1+sin(mV)), where m is a constant, and V is the amplitude of the voltage signal. As depicted in FIG. 8 and FIG. 6, the value of m is selected to be about k/4. As depicted, curve 806 represents the intensity of third optical signal 150 in FIG. 1. Point 808 of curve 806 corresponds to a value of about zero for a voltage signal, such as input signal 102 in FIG. 1.

Figure 9:
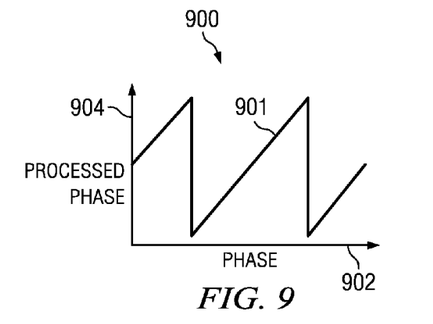
FIG. 9 is an illustration of a graph of the phase of a digitized signal in accordance with an advantageous embodiment.

With reference now to FIG. 9, an illustration of a graph of the phase of a digitized signal is depicted in accordance with an advantageous embodiment. Graph 900 illustrates the phase of curve 901 as the phase relates to an input voltage signal. For example, curve 901 may be the output of two-argument inverse-tangent function 143 in FIG. 1, and the input voltage signal may be, for example, input signal 102 in FIG. 1.

In this illustrative example, graph 900 has horizontal axis 902 and vertical axis 904. Horizontal axis 902 represents the amplitude of an input voltage signal, and vertical axis 904 represents the phase of curve 901 based on the input voltage signal. In particular, vertical axis 904 represents the phase of curve 901 after the input voltage signal is processed into a digitized signal. As depicted in this example, the phase of curve 901 is ambiguous. In other words, the phase is not specified as being within a range from about 0 to about 2 pi, from about 2 pi to about 4 pi, or from some other range of phase.

Figure 10:
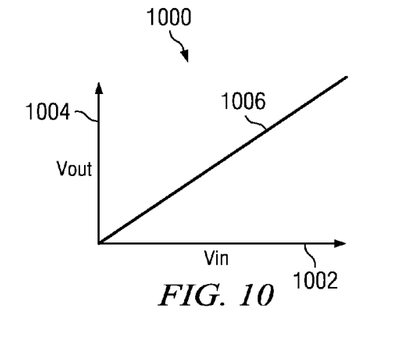
FIG. 10 is a graph of a digitized signal in accordance with an advantageous embodiment.

With reference now to FIG. 10, a graph of a digitized signal is depicted in accordance with an advantageous embodiment. In this illustrative example, graph 1000 has horizontal axis 1002 and vertical axis 1004. Horizontal axis 1002 represents the amplitude of an input voltage signal, and vertical axis 1004 represents the values for digitized signal 1006 based on the input voltage signal. As depicted, digitized signal 1006 has values substantially linearly proportional to the input voltage signal. In this example, digitized signal 1006 may be generated as digital data, such as digital data 142 as generated by analog to digital conversion system 108 in FIG. 1.

In this illustrative example, digitized signal 1006 is based on processing digitized samples from curve 806 and curve 901. A selected integer multiple of 2 pi radians is added to digitized signal 1006 to correct for the phase. This selected integer multiple of 2 pi radians depends on the values of samples from curve 806 and the corresponding values of samples from curve 901. The correction of phase eliminates ambiguity of phase that is present for curve 901. After digitized signal 1006 is corrected for phase, the signal may be further processed by dividing by k. The result of this processing may be digital data that corresponds to the input voltage signal.

Figure 11:
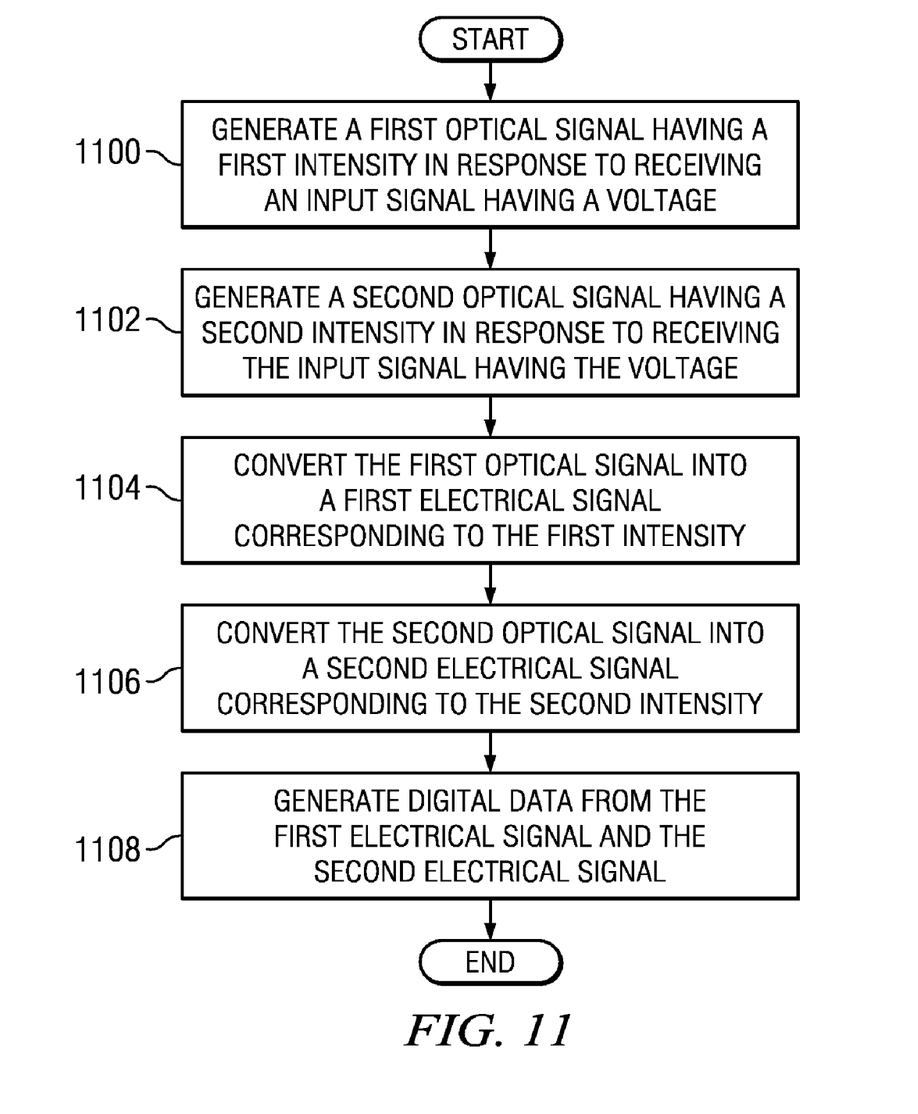
FIG. 11 is an illustration of a flowchart of a process for encoding signals in accordance with an advantageous embodiment.

With reference now to FIG. 11, an illustration of a flowchart of a process for encoding signals is depicted in accordance with an advantageous embodiment. The process illustrated in FIG. 11 may be implemented in signal processing environment 100 in FIG. 1.

The process begins by generating a first optical signal having a first intensity in response to receiving an input signal having a voltage (operation 1100). In operation 1100, the first optical signal may be formed by combining a first pair of optical signals having a first phase difference. The first intensity of the first optical signal is based on the first phase difference. The process generates a second optical signal having a second intensity in response to receiving the input signal having the voltage (operation 1102).

In operation 1102, the second optical signal may be formed by combining a second pair of optical signals having a second phase difference. The second intensity of the second optical signal is based on the second phase difference. In this illustrative example, the first phase and the second phase have a phase difference such that the first optical signal reaches a peak at a different time from the second optical signal. The first and second optical signals may be generated using a modulation system, such as modulation system 104 in FIG. 1.

Thereafter, the process converts the first optical signal into a first electrical signal corresponding to the first intensity (operation 1104). The process converts the second optical signal into a second electrical signal corresponding to the second intensity (operation 1106). Operations 1104 and 1106 may be performed using optical detector system 106 in FIG. 1. The process then generates digital data from the first electrical signal and the second electrical signal (operation 1108), with the process terminating thereafter. The generation of the digital data may be performed using an analog to digital conversion system such as, for example, digital signal processor 140 in FIG. 1.

The description of the different advantageous embodiments has been presented for purposes of illustration and description, and it is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
a modulation system configured to generate a first pair of optical signals having a first phase difference and a second pair of optical signals having a second phase difference in response to an input signal, the input signal is selected from one of a voltage signal, a current signal, a frequency signal, and a charge, wherein the first pair of optical signals are combined to form a first optical signal having a first intensity and the second pair of optical signals are combined to form a second optical signal having a second intensity, and wherein the first intensity of the first optical signal reaches a peak at a different time from the second intensity of the second optical signal;
an optical detector system coupled to the modulation system, wherein the optical detector system is configured to generate a first electrical signal corresponding to the first intensity of the first optical signal and a second electrical signal corresponding to the second intensity of the second optical signal; and
an analog to digital conversion system connected to the optical detector system, wherein the analog to digital conversion system is configured to generate digital data from the first electrical signal and the second electrical signal.

2. The apparatus of claim 1, wherein the first intensity of the first optical signal is based on the first phase difference and the second intensity of the second optical signal is based on the second phase difference.

3. The apparatus of claim 1, wherein the first pair of optical signals and the second pair of optical signals are combined in a constructive combination or a destructive combination.

4. The apparatus of claim 1, wherein the optical detector system comprises:
a first optical detector coupled to the first optical signal, wherein the first optical detector is configured to generate the first electrical signal corresponding to the first intensity; and
a second optical detector coupled to the second optical signal, wherein the second optical detector is configured to generate the second electrical signal corresponding to the second intensity.

5. The apparatus of claim 1, wherein the modulation system comprises:
a plurality of interferometers configured to modulate an optical signal to generate the first optical signal and the second optical signal.

6. The apparatus of claim 1, wherein the first optical signal is substantially proportional to $(1+\sin(kV))$, and the second optical signal is substantially proportional to $(1+\cos(kV))$, and wherein k is a constant and V is voltage.

7. The apparatus of claim 1 further comprising:
a light source configured to generate an optical signal used by the modulation system to generate the first optical signal and the second optical signal.

8. The apparatus of claim 1, wherein the analog to digital conversion system is configured to perform a two-argument inverse tangent operation using the first optical signal and the second optical signal to generate the digital data.

9. The apparatus of claim 1, wherein the analog to digital conversion system comprises a processor.

10. The apparatus of claim 6, wherein the modulation system is configured to generate a third optical signal having a third intensity substantially proportional to the input signal, wherein the third optical signal is used to recover a phase of modulation.

11. The apparatus of claim 10, wherein the phase of modulation is substantially linearly related to the voltage.

12. The apparatus of claim 10, wherein the modulation system is configured to generate a fourth optical signal having a fourth intensity and a fifth optical signal having a fifth intensity, wherein the fourth optical signal is substantially proportional to $(1-\sin(kV))$, and the fifth optical signal is substantially proportional to $(1-\cos(kV))$, and wherein the fourth optical signal and the fifth optical signal are used to reduce or eliminate noise.

13. A method for encoding data, the method comprising:
responsive to receiving an input signal having a voltage, generating a first pair of optical signals having a first phase difference, wherein the input signal is selected from one of a voltage signal, a current signal, a frequency signal, and a charge;
responsive to receiving the input signal having the voltage, generating a second pair of optical signals having a second phase difference;
combining the first pair of optical signals to form a first optical signal having a first intensity;
combining the second pair of optical signals to form a second optical signal having a second intensity, wherein the first intensity of the first optical signal reaches a peak at a different time from the second intensity of the second optical signal;
converting the first optical signal into a first electrical signal corresponding to the first intensity;
converting the second optical signal into a second electrical signal corresponding to the second intensity; and
generating digital data from the first electrical signal and the second electrical signal.

14. The method of claim 13, wherein the step of combining the first pair of optical signals to form the first optical signal having the first intensity comprises:
combining the first pair of optical signals to form the first optical signal having the first intensity, wherein the first intensity of the first optical signal is based on the first phase difference; and
wherein the step of combining the second pair of optical signals to form the second optical signal having the second intensity comprises:
combining the second pair of optical signals to form the second optical signal having the second intensity, wherein the second intensity of the second optical signal is based on the second phase difference.

15. The method of claim 13 further comprising:
generating a third optical signal having a third intensity substantially proportional to the input signal, wherein the third optical signal is used to recover a phase of modulation.

16. The method of claim 13, wherein the step of generating the digital data from the first electrical signal and the second electrical signal comprises:
performing a two-argument inverse tangent operation, by an analog to digital conversion system, using the first optical signal and the second optical signal to generate the digital data.

17. The method of claim 13, wherein the step of combining the first pair of optical signals to form the first optical signal having the first intensity comprises:

combining the first pair of optical signals to form the first optical signal having the first intensity, wherein the first optical signal is substantially proportional to (1+sin(kV)), and wherein k is a constant and V is an amplitude of the voltage signal; and wherein the step of combining the second pair of optical signals to form the second optical signal having the second intensity comprises:

combining the second pair of optical signals to form the second optical signal having the second intensity, wherein the second optical signal is substantially proportional to (1+cos(kV)).

18. The method of claim 13, wherein the step of generating the first pair of optical signals having the first phase difference in response to receiving the input signal comprises:

responsive to receiving the input signal, generating the first pair of optical signals having the first phase difference using a modulation system; and wherein the step of generating the second pair of optical signals having the second phase difference in response to receiving the input signal comprises:

responsive to receiving the input signal, generating the second pair of optical signals having the second phase difference using the modulation system.

19. The method of claim 13, wherein the step of converting the first optical signal into the first electrical signal corresponding to the first intensity comprises:

converting the first optical signal into the first electrical signal corresponding to the first intensity using an optical detector system; and wherein the step of converting the second optical signal into the second electrical signal corresponding to the second intensity comprises:

converting the second optical signal into the second electrical signal corresponding to the second intensity using the optical detector system.

20. The method of claim 13, wherein the step of generating the digital data from the first electrical signal and the second electrical signal further comprises:

generating the digital data from the first electrical signal and the second electrical signal using an analog to digital conversion system.

* * * * *